US011171430B2

(12) United States Patent
Ostmeier et al.

(10) Patent No.: US 11,171,430 B2
(45) Date of Patent: Nov. 9, 2021

(54) ICE TEST SYSTEM AND METHODS

(71) Applicants: Hubert Ostmeier, Alexandria, VA (US); Emmanuel Ostmeier, Alexandria, VA (US)

(72) Inventors: Hubert Ostmeier, Alexandria, VA (US); Emmanuel Ostmeier, Alexandria, VA (US)

(*) Notice: Subject to any disclaimer, the term of this patent is extended or adjusted under 35 U.S.C. 154(b) by 187 days.

(21) Appl. No.: 16/558,000

(22) Filed: Aug. 30, 2019

(65) Prior Publication Data

US 2020/0076096 A1 Mar. 5, 2020

Related U.S. Application Data

(60) Provisional application No. 62/725,231, filed on Aug. 30, 2018.

(51) Int. Cl.

| | |
|---|---|
| *G01R 31/327* | (2006.01) |
| *H01R 9/24* | (2006.01) |
| *H01R 9/18* | (2006.01) |
| *G01R 31/08* | (2020.01) |
| *G01R 31/00* | (2006.01) |

(52) U.S. Cl.
CPC ......... *H01R 9/2433* (2013.01); *G01R 31/008* (2013.01); *G01R 31/085* (2013.01); *G01R 31/086* (2013.01); *G01R 31/3278* (2013.01); *H01R 9/18* (2013.01); *H01R 9/2475* (2013.01); *H01R 9/2491* (2013.01)

(58) Field of Classification Search
CPC .............. G01R 31/327; G01R 31/3272; G01R 31/3278; G01R 31/2829; G01R 31/31905; G01R 31/31937; G01R 15/14; G01R 19/0084; H01R 9/2433; H01R 9/2475; H01R 9/2491; H01R 9/2666; H01R 9/2633; H01R 24/20; H01R 24/28; H01R 2201/20

See application file for complete search history.

(56) References Cited

U.S. PATENT DOCUMENTS

| | | | |
|---|---|---|---|
| 8,461,856 B2* | 6/2013 | Ostmeier | G01R 15/14 324/756.05 |
| 9,423,462 B1* | 8/2016 | Curtis | G01R 31/327 |
| 2005/0250376 A1* | 11/2005 | Ostmeier | H01R 24/20 439/521 |

(Continued)

*Primary Examiner* — Thang X Le
(74) *Attorney, Agent, or Firm* — Von Rohrscheidt Patents

(57) ABSTRACT

A test system and method for relay connection and testing of a power transmission and distribution grid including a fixed connection block connected to the power transmission and distribution grid, and a mobile plug which connects the fixed connection block or a mobile test block with the relay when the mobile plug is inserted into the fixed connection block or the mobile test block. The mobile test block provides a connection to an external relay testing device when the mobile test plug is inserted into the mobile test block, the fixed connection block provides internal shorting that is activated when the mobile plug is not inserted into the fixed connection block and is deactivated when the mobile plug is inserted into the fixed connection block, and the fixed connection block, mobile plug, and the mobile test block provides an interaction between a power transmission and distribution grid side and a relay side. This allows a quick recovery when relays are damaged in a cyber-attack.

20 Claims, 13 Drawing Sheets

(56) References Cited

U.S. PATENT DOCUMENTS

| | | | | |
|---|---|---|---|---|
| 2011/0089961 A1* | 4/2011 | Ostmeier | ............... | G01R 15/14 |
| | | | | 324/754.03 |
| 2015/0146333 A1* | 5/2015 | Wu | ...................... | H01H 47/002 |
| | | | | 361/93.1 |
| 2017/0292975 A1* | 10/2017 | France | ............... | G01R 31/2829 |

* cited by examiner

ICE TEST SYSTEM AND METHODS

RELATED APPLICATIONS

This application claims priority from and incorporates by reference U.S. Provisional Patent Application 62/725,231 filed on Aug. 30, 2018.

FIELD OF INVENTION

The present invention relates generally to Interface Control Equipment (ICE) test systems and methods for relay connection and testing of a power transmission and distribution grid. These ICE test systems include a fixed connection block connected to the power transmission and distribution grid; and a mobile plug which connects the fixed connection block or a mobile test block with the relay when the mobile plug is inserted into the fixed connection block or the mobile test block. The mobile test block provides a connection to an external relay testing device when the mobile test plug is inserted into the mobile test block.

ICE test systems and method are typically used in medium to high voltage power transmission and distribution grids to prevent accidental damage.

BACKGROUND OF THE INVENTION

The prior art test systems for relay connection and testing in power transmission and distribution have proven to be complex and difficult in providing a secure interaction between the grid side and the relay side. The prior art test systems fail to provide a sufficiently long-time stable connection between the grid and the relay and have been prone to accidents.

BRIEF SUMMARY OF THE INVENTION

Objects of the invention may be provided by a test system for relay connection and testing of a power transmission and distribution grid including a fixed connection block connected to the power transmission and distribution grid, and a mobile plug which connects the fixed connection block and a mobile test block with the relay when the mobile plug is inserted into the fixed connection block. The mobile test block provides a connection to an external relay testing device when the mobile test plug is inserted into the mobile test block, the fixed connection block provides internal shorting that is activated when the mobile plug is not inserted into the fixed connection block and is deactivated when the mobile plug is inserted into the fixed connection block, and the fixed connection block, mobile plug, and the mobile test block provides an interaction between a power transmission and distribution grid side and a relay side. The fixed connection block, mobile plug, and the mobile test block may provide a stable connection between the power transmission and distribution grid and the relay. The internal shorting may be provided at a backside of the fixed connection block. At least one of the fixed connection block, mobile plug, and the mobile test block may include labeling to identify connections. Alternatively, each of the fixed connection block, mobile plug, and the mobile test block include may labeling to identify connections. The labeling may include color coding. The mobile plug may be attached to the fixed connection block by screws. The coded tips may include plastic bars, and at least two of the coded tips have plastic bars which are different from each other. Objections of the invention may also be provided by implementing a method like the above.

Further objects of the invention may be provided with a method for fixing an improperly functioning relay of a power transmission and distribution grid including providing a replacement relay which is properly configured, providing a fixed connection block connected to the power transmission and distribution grid, providing a plug which connects the fixed connection block and an original relay when the mobile plug is inserted into the fixed connection block, and testing the original relay and when it is not functioning correctly, replacing the original relay with the replacement relay. The fixed connection block provides internal shorting that is activated when the mobile plug is not inserted into the fixed connection block and is deactivated when the mobile plug is inserted into the fixed connection block, and the fixed connection block and mobile plug provides an interaction between a power transmission and distribution grid side and a relay side when the mobile plug is inserted into the fixed connection block.

BRIEF DESCRIPTION OF THE DRAWINGS

The invention is now described in more detail based on an advantageous embodiment with reference to drawing figures, wherein.

DETAILED DESCRIPTION OF THE INVENTION

The ICE test system and its associate method are a smart solution for relay connection and testing in power transmission and distribution. The ICE test system provides an easy and secure interaction between the grid side and the relay side. The ICE test system provides a long-time stable connection between the grid and the relay. In case of relay changing and relay testing, the ICE test system provides a fast and easy plug-out and plug-in while always ensuring the safety of the user and the electrical devices.

The ICE test system includes three different components: 1) The ICEF is the fixed connection block at the grid side; 2) The ICEM is the mobile plug which connects the ICEF and the ICET block with the relay; and 3) The ICET is the mobile test block which allows the connection to the external relay testing device.

The ICEF is the fixed block of the ICE system which is always connected to the grid side. It is surface mounted on a DIN rail for a permanent installation at the switchboard. The DIN rail fixation can be easily accessed from the top side on the left and right side by head cap screws. The wiring from the grid is connected to the front of the ICEF block by screws to ensure a long-term stable electrical connection. On the top of the ICEF block are the plug connector slots. Here, the fitting ICEM plug can be connected to the bending contact springs of the plug connector. To prevent the accidental plug-out of the plug, a knurled screw fixation slot is installed at the block. On the backside (side away from the viewer) of the ICEF block the internal shortings are built-in. These internal shortings are inbuilt to protect the current transformers from overloading. Through the bending contact springs, the internal shortings are automatically deactivated in case of plug-in of the ICEM plug and automatically activated in reverse. The labelings on the top, at the front and at the back side indicate the single lines and connections. The multiple options of colors and inscription allow a huge variety of customization.

Figure 1:
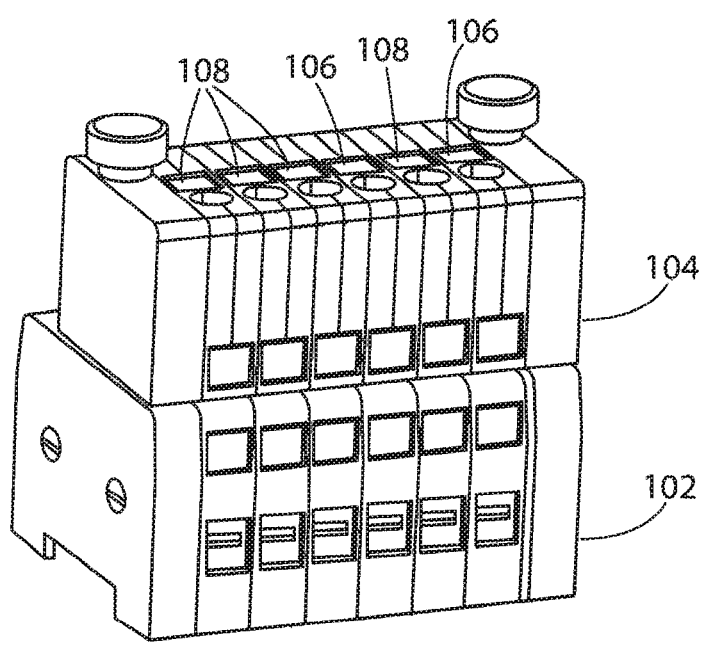
FIG. 1 illustrates a 3D image of ICEF block combined with ICEM plug.
Figure 2:
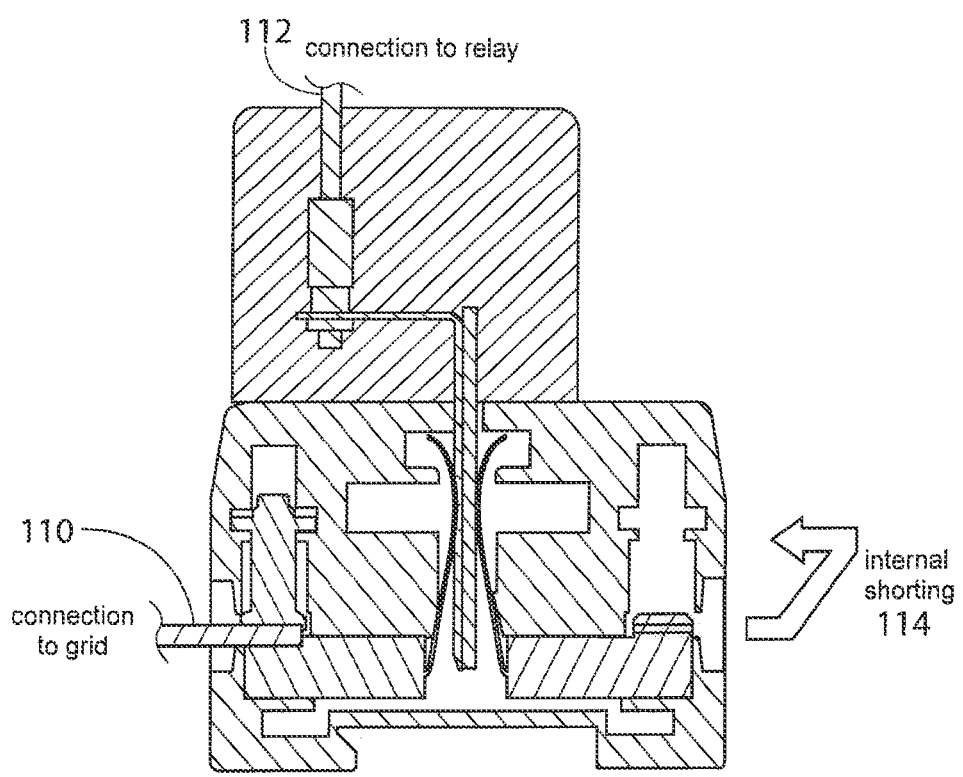
FIG. 2 illustrates ICEF block with ICEM plug, internal shorting deactivated.
Figure 3:
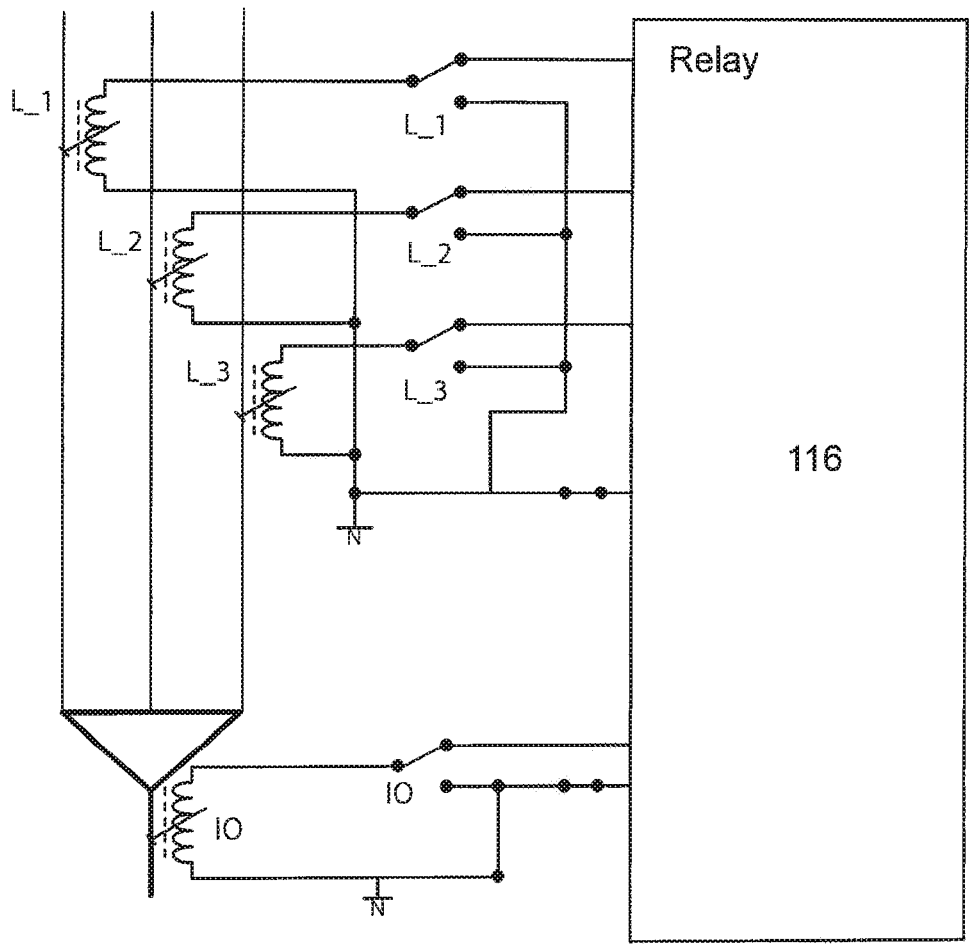
FIG. 3 illustrates circuit diagram for ICEF block with ICEM plug, internal shorting deactivated.

FIGS. 1 and 2 illustrate the connection mode when the ICEM plug is inserted in the ICEF block. Through the inserted ICEM plug the relay is connected to the grid as is illustrated in FIG. 3. The connections of L1, L2, L3 and I0 on the left side are colored in red. The cable coming from the grid is installed by the screw connection on the left side. Through the connection between the plug pin and the flexible contact spring the electrical connections are stable, and the electrical contact goes further to the jack at the top of the plug where a cable is fixed by a stable screw connector. The cable is installed at the relay. The internal shorting on the right side of ICEF block (N line) is colored blue. The N line is completely disconnected from the left side by the plastic portion of the pin of the ICEM plug. The internal shorting is deactivated.

Figure 4:
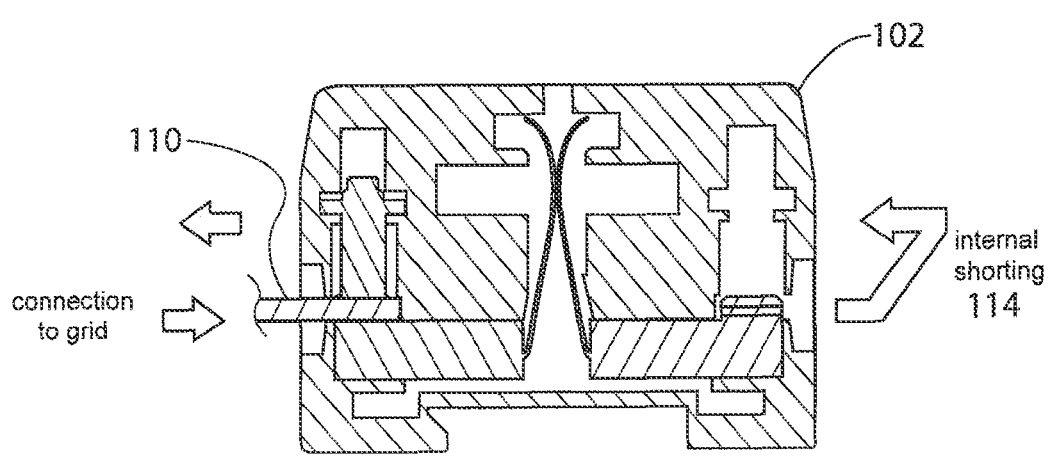
FIG. 4 illustrates ICEF block without ICEM plug, internal shorting activated.
Figure 5:
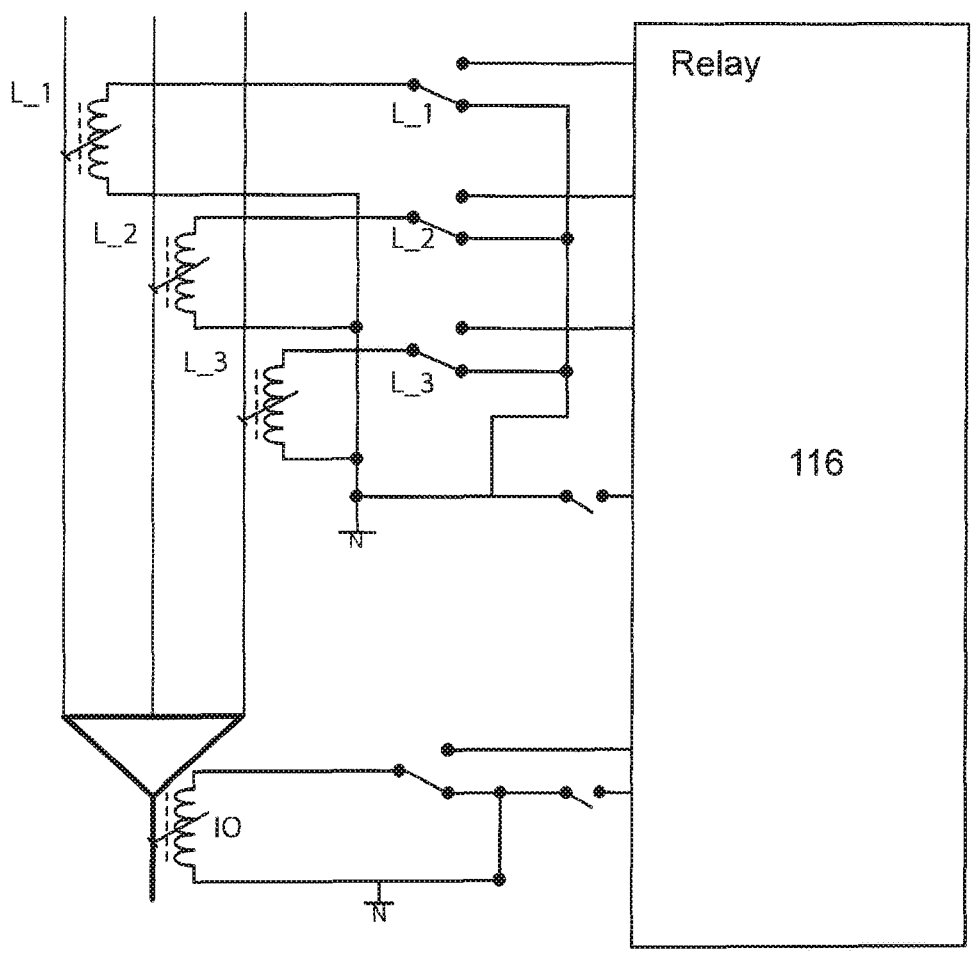
FIG. 5 illustrates circuit diagram of ICEF block without ICEM plug, internal shorting activated.

FIG. 4 illustrates the disconnection mode when the ICEM plug is not inserted in the ICEF block. In this case no connection to the relay is present. The connection to the current transformer of the grid side is still present as is illustrated in FIG. 5. To protect the current transformer from overloading, the internal shorting on the right is activated when the ICEM plug is removed from the ICEF block. In this case, the lines L1, L2, L3 and I0 on the left side are directly connected to the neutral line N on the right side. The internal shorting jumps from the shown module to the following module and connects the lines L1, L2, L3 and I0 to the neutral line, which is grounded. In the case of the first 4 poles it jumps from pole 1 to pole 4 to short all 4 poles (L1, L2, L3 and N), for the following poles from one pole to the next pole (IO to IO-N).

The internal shortings are always automatically activated and automatically deactivated, since the flexible contact springs in the middle of the ICEF are bent under pressure. After pulling the plug pin out of the block, the contact springs remove to the middle position and ensure a stable and secure connection. Through the geometry of the contact springs a "make-before-break" function—is always ensured. U.S. Pat. No. 8,461,856, which is incorporated in its entirety by this reference, teaches further details on the "make-before-break" function.

Figure 7:
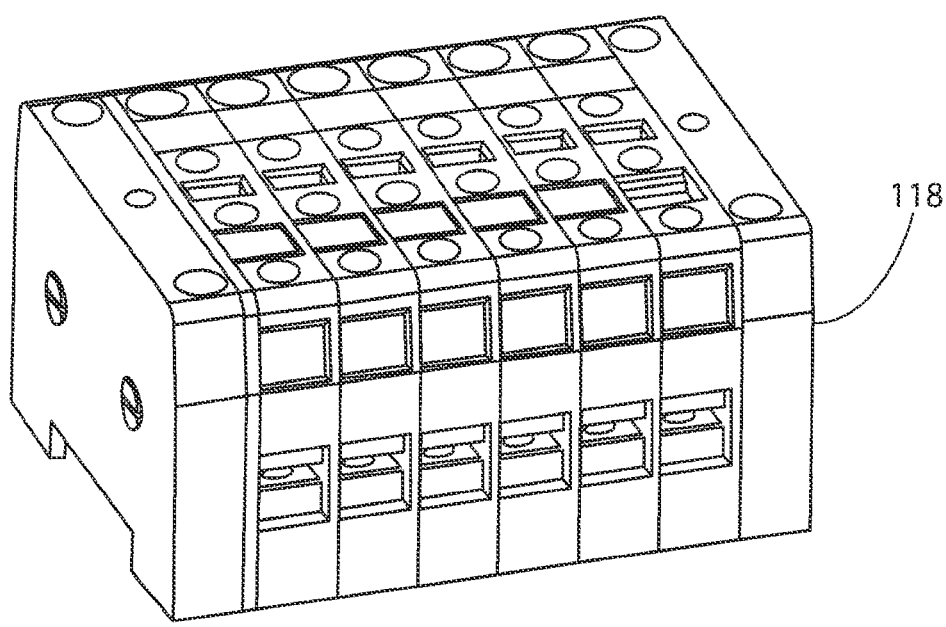
FIG. 7 illustrates 3D image of the ICET block.
Figure 8:
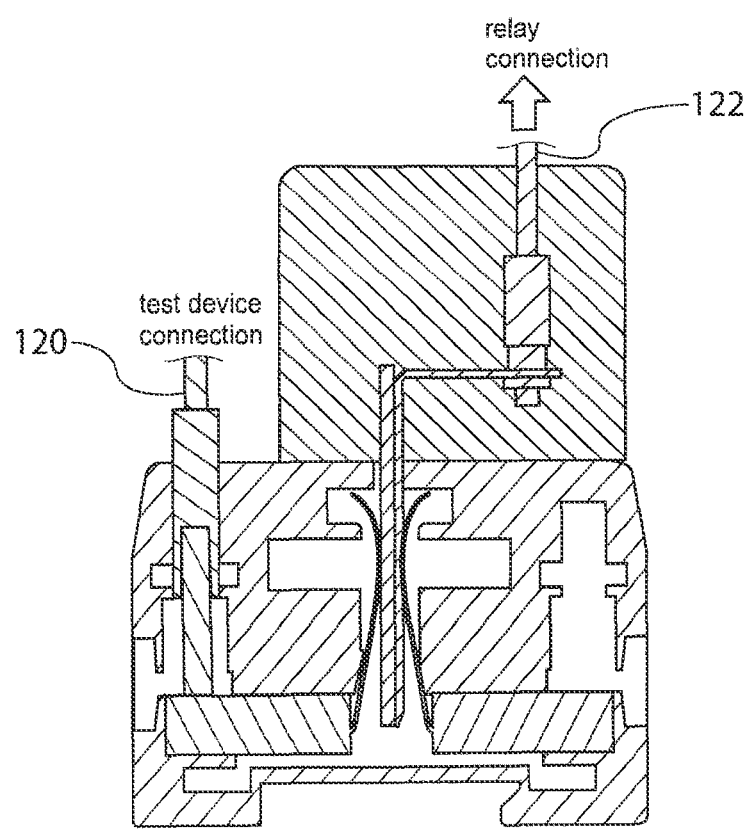
FIG. 8 illustrates ICET block with ICEM plug, testing mode.
Figure 9:
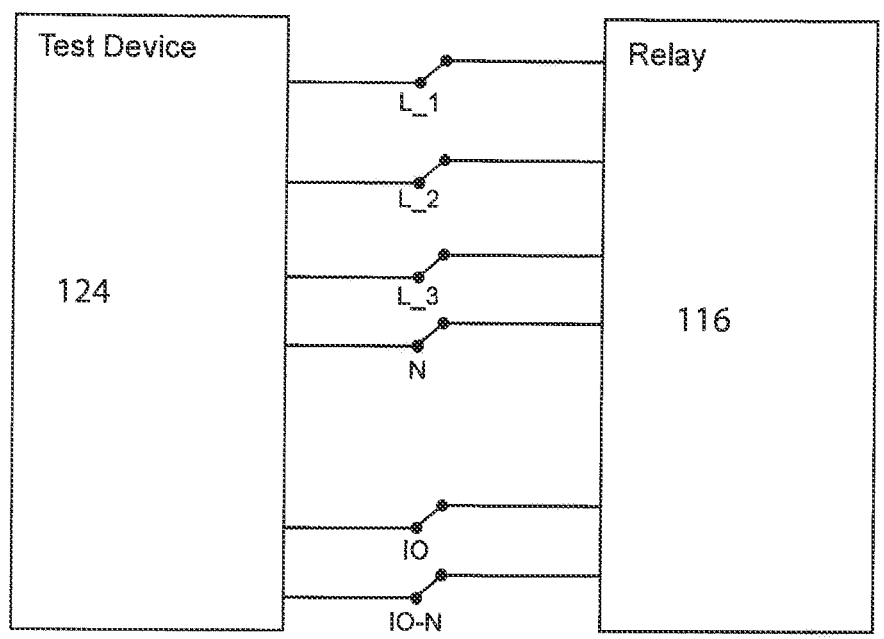
FIG. 9 illustrates circuit diagram for ICET block with ICEM plug, testing mode.

The ICET block is the mobile test connection block of the ICE test system as is illustrated in FIG. 7. Combined with the ICEM plug the ICET block connects the relay with the relay test device. On the top in the middle of the ICET are the plug connector slots. Here, the fitting ICEM plug can be connected to the bending contact springs of the plug connector. To prevent the accidental plugout of the plug, a knurled screw fixation slot is installed at the block. To connect the relay testing device to the test block, the banana jacks at the top at the back position can be applied. Here any type of relay testing device can be installed with standard banana plugs. Furthermore, the single lines can be separately tested. FIG. 8 illustrates the complete connection from the test device input at the ICET block to the relay output at the ICEM plug. FIG. 9 illustrates the complete circuit diagram for ICET with ICEM plug in the relay testing mode. The labeling on the top, at the front and at the back side indicates the single lines and connections.

The ICEM is the mobile plug of the ICE test system. It is always connected to the relay side. On the top are the cable slots for the relay cable connection. Through the screws the connection is solid. On the bottom the pins for the block connection are visible. Through the brass tip an easy opening of the contact springs of the ICEF blocks and the ICET blocks is ensured. The brass tips are coded by different plastic bars. The coding guarantees the correct insertion of the plug into the connection slots of the block and prevents a misuse failure.

The knurled screw fixation at the left and right sides are installed to establish a firm and permanent connection between plug and blocks. In case of relay changing or relay testing the screw fixation can be easily unfastened and fastened without any tool. The labelings on the top, at the front, and at the back side indicate the single lines and connections.

The invention provides certain advantages. Turning off power transmission and distribution grid systems is very disruptive. Thus, turning off the power transmission and distribution grid for testing or repairs of relays should be avoided where possible. With the invention, relays may be tested and/or replaced without turning off the power transmission and distribution grid. For example, a technician may pull out the ICEM plug of a relay and immediately insert a new relay without turning off the power transmission and distribution system. The internal shorting provides protection during reconnection of the relay so that neither the power transmission and distribution gird nor any other component are damaged during reconnection. At the moment of reconnecting the converter is protected in the system by the short-circuiting bridges.

The invention can be used not only for testing and routine maintenance but in other circumstances also. One such other circumstance where the invention would be highly advantageous is where a cyber-attack changes the setpoints of the relays to disable the power transmission and distribution grid system. Such cyber-attacks already have precedents in the recent past. However, affected relays can be quickly isolated and replaced by using the invention. The removed relays can then be examined later. This allows for a quick restart of such an attacked system.

Figure 6:
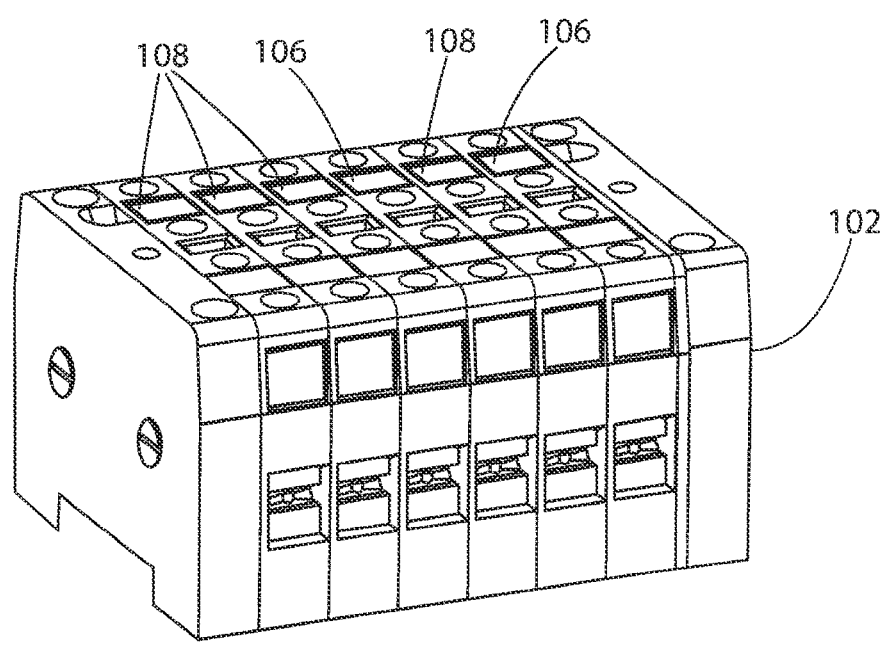
FIG. 6 illustrates a 3D image of ICEF block.

FIG. 1 illustrates a 3D image of ICEF block 102 combined with ICEM plug 104. The ICEM plug 104 includes labelings 106 corresponding to connections of N and 10-N (which may be blue) and labelings 108 corresponding to corresponding to connections of L1, L2, L3 and I0 (which may be red). FIG. 6 illustrates a 3D image of ICEF block 102.

FIG. 2 illustrates ICEF block 102 with ICEM plug 104 with its internal shorting 114 deactivated. With the internal shorting 114 deactivated, the connection to the grid 110 is connected to the connection to the relay 112.

FIG. 3 illustrates circuit diagram for ICEF block 102 with ICEM plug 104 with its internal shorting 114 deactivated. As illustrated in FIG. 3, a relay 116 is connected to the ICEF block 102 with the ICEM plug 104 because its internal shorting 114 is deactivated.

FIG. 4 illustrates ICEF block 102 without ICEM plug 104 with its internal shorting 114 activated. With the internal shorting 114 activated, the connection to the grid 110 is connected to the connection to the relay 112.

FIG. 5 illustrates circuit diagram of ICEF block 102 without ICEM plug 104, internal shorting 114 activated. As illustrated in FIG. 5, the relay 116 is disconnected to the ICEF block 102 with the ICEM plug 104 because its internal shorting 114 is activated. The ICEM plug 104 may be attached with screws 128.

FIG. 7 illustrates 3D image of the ICET block 118.

FIG. 8 illustrates ICET block 118 with ICEM plug 104 in a testing mode. Both contact springs of the ICET block 118 are always connected with the test device connection 120 no matter if the ICEM plug 104 is inserted or not. In FIG. 8 the ICEM plug 104 is illustrated with the plastic insulation on the left side so that the relay connection 122 is connected to the right contact spring. Since the right contact spring and the left contact spring are always internally connected the ICEM plug 104 can also be inserted rotated by 180 degrees so that the relay connection 122 is connect with the left contact spring. In the testing mode, the testing device connection 120 is connected to the relay connection 122.

FIG. 9 illustrates circuit diagram for ICET block 118 with ICEM plug 104 in a testing mode.

Figure 10:
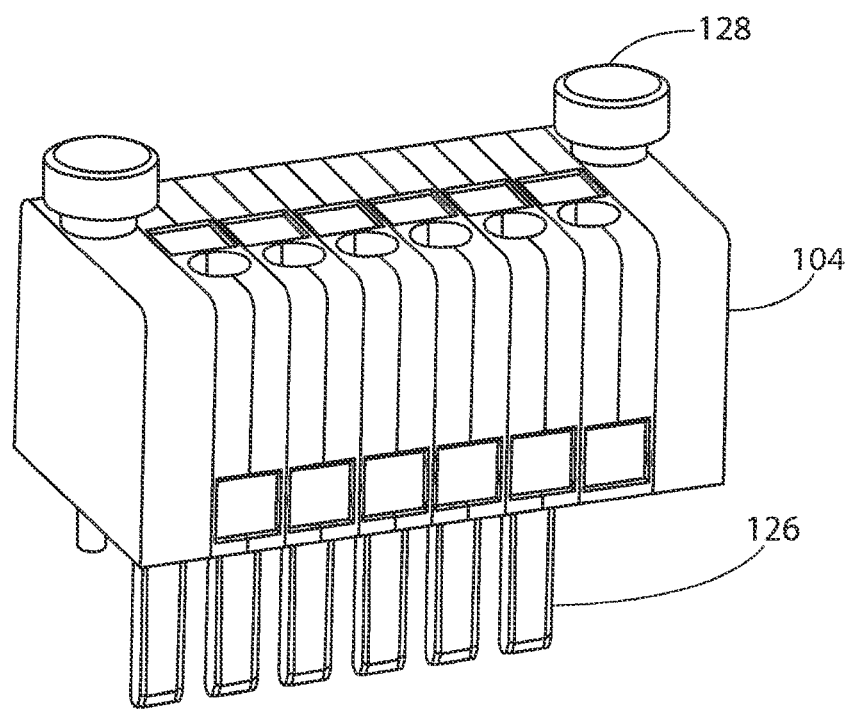
FIG. 10 illustrates 3D image of the ICEM plug.

FIG. 10 illustrates 3D image of the ICEM plug 104. The ICEM plug 104 include tips 126 which may be made from brass or any other suitable conductor. Furthermore, the tips 126 may include coding to ensure correct insertion. The coding is implemented by including differing plastic bars. When the ICEM plug 104 is inserted into the ICEF block 102, the tip 126 is inserted between two conductors which are part of the ICEF block 102 which effectively operate as switches (e.g., L1, L2, L3 and I0). The switches are closed when the two conductors are in contact because the ICEM plug 104 has not been inserted. Conversely, the switches (e.g., L1, L2, L3 and I0) are open when the two conductors are in not contact with each other because the ICEM plug 104 has been inserted. The insertion of the ICEM plug 104 separates the two conductors by having the tips 126 have a conductive material in contract with one of the two conductors of the ICEF block 102 and a non-conductive material (e.g., plastic) in contact with the other one of the two conductors of the ICEF block 102.

Figure 11:
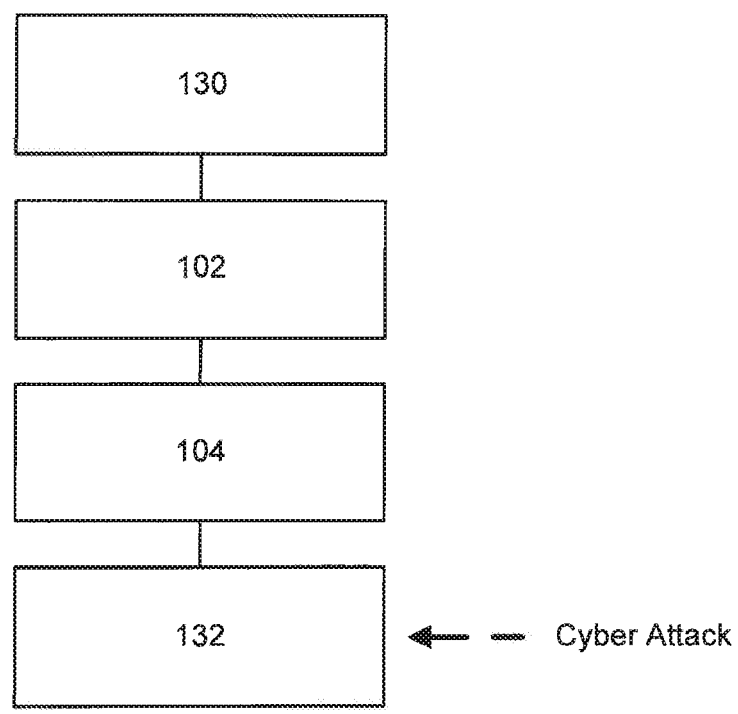
FIG. 11 illustrates a sabotaged relay resulting from a cyber-attack.

FIG. 11 illustrates a sabotaged relay 132 resulting from a cyber-attack. A power transmission and distribution grid 130 is connected in sequence to the ICEF block 102, the ICEM plug 104, and the sabotaged relay 132. The sabotaged relay 132 adversely affects the power transmission and distribution grid 130 which may result in the power transmission and distribution grid 130 going offline. It is critical to minimize the time the power transmission and distribution grid 130 is offline for testing and repair subsequent to a cyber-attack or other adverse event. The invention allows for rapid testing for sabotaged (or alternatively simply malfunctioning) relays and the subsequent replacement of those relays with a replacement relay.

Figure 12:
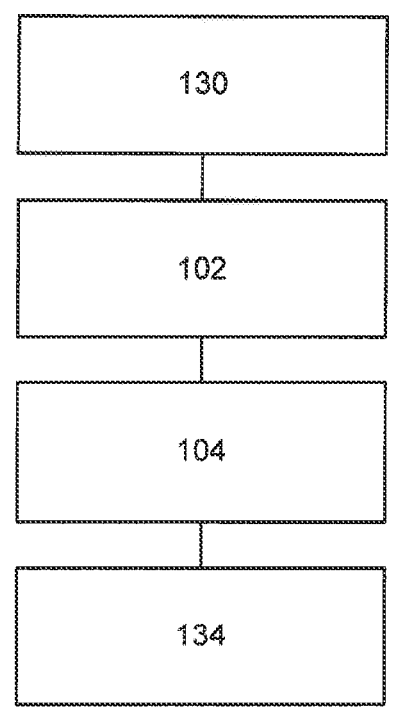
FIG. 12 illustrates a replace relay substituted for the sabotaged relay.

FIG. 12 illustrates a replaced relay 134 substituted for the sabotaged relay 132. The replacement of the sabotaged relay 132 with replaced relay 134 helps to return the power transmission and distribution grid 130 to proper functioning so that it may be brought back online. The replaced relay 132 is simply a relay with the required configuration (e.g., it is configured the same way the sabotage relay 134 was configured prior to the cyber-attack).

Figure 13:
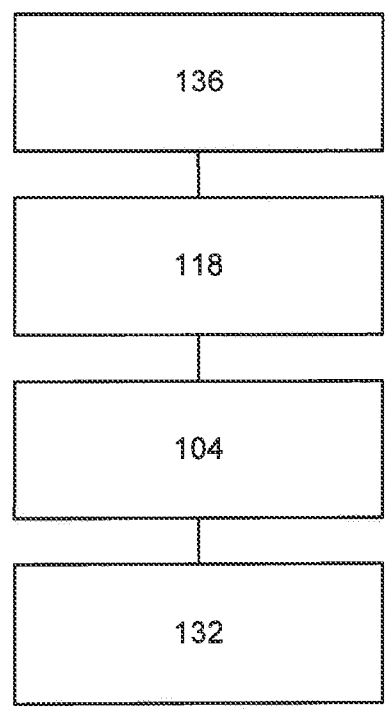
FIG. 13 illustrates the configuration to test the sabotaged relay.

FIG. 13 illustrates the configuration to test the sabotaged relay 132. Testing the sabotaged relay 132 is done by connecting a test set 136 to the ICET block 118 to the ICEM plug 104 to the sabotaged relay 132. This testing is done after the sabotaged relay 132 has been disconnected from the power transmission and distribution grid 130.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims.

REFERENCE NUMERALS AND DESIGNATIONS

102 ICEF block
104 ICEM plug
106 Labelings corresponding to connections of N and 10-N
108 Labelings corresponding to connections of L1, L2, L3 and I0
110 Connection to the grid
112 Connection to the relay
114 Internal shorting
116 Relay
118 ICET block
120 Test device connection
122 Relay connection
124 Test device
126 Tips
128 Screw
130 Power transmission and distribution grid
132 Sabotaged relay
134 Replaced relay
136 Test set

What is claimed is:

1. A test system for relay connection and testing of a power transmission and distribution grid, comprising:
   a fixed connection block connected to the power transmission and distribution grid; and
   a mobile plug which connects the fixed connection block or a mobile test block with a relay when the mobile plug is inserted into the fixed connection block or the mobile test block,
   wherein the mobile test block provides a connection to an external relay testing device when the mobile test plug is inserted into the mobile test block,
   wherein the fixed connection block provides internal shorting that is activated when the mobile plug is not inserted into the fixed connection block and is deactivated when the mobile plug is inserted into the fixed connection block, and
   wherein the fixed connection block, the mobile plug, and the mobile test block provides an interaction between a power transmission and distribution grid side and a relay side when the mobile plug is inserted into the fixed connection block.

2. The test system according to claim 1, wherein the fixed connection block, the mobile plug, and the mobile test block provide a stable connection between the power transmission and distribution grid and a relay.

3. The test system according to claim 1, wherein the internal shorting is provided at a backside of the fixed connection block.

4. The test system according to claim 1, wherein at least one of the fixed connection block, the mobile plug, and the mobile test block include labeling to identify connections.

5. The test system according to claim 4, wherein the labeling includes color coding.

6. The test system according to claim 1, wherein each of the fixed connection block, the mobile plug, and the mobile test block include labeling to identify connections.

7. The test system according to claim 6, wherein the labeling includes color coding.

8. The test system according to claim 1, wherein the mobile plug is attached to the fixed connection block by screws.

9. The test system according to claim 1, wherein the mobile plug includes pins having coded tips.

10. The test system according to claim 9, wherein the coded tips include plastic bars, and at least two of the coded tips have plastic bars which are different from each other.

11. A method for a test system for relay connection and testing of a power transmission and distribution grid, comprising:
    providing a fixed connection block connected to the power transmission and distribution grid; and
    providing a mobile plug which connects the fixed connection block or a mobile test block with a relay when the mobile plug is inserted into the fixed connection block or the mobile test block,
    wherein the mobile test block provides a connection to an external relay testing device when the mobile test plug is inserted into the mobile test block,
    wherein the fixed connection block provides internal shorting that is activated when the mobile plug is not inserted into the fixed connection block and is deactivated when the mobile plug is inserted into the fixed connection block, and
    wherein the fixed connection block, the mobile plug, and the mobile test block provides an interaction between a power transmission and distribution grid side and a relay side when the mobile plug is inserted into the fixed connection block.

12. The method according to claim 11, wherein the fixed connection block, the mobile plug, and the mobile test block provide a stable connection between the power transmission and distribution grid and the relay.

13. The method according to claim 11, wherein the internal shorting is provided at a backside of the fixed connection block.

14. The method according to claim 11, wherein at least one of the fixed connection block, the mobile plug, and the mobile test block include labeling to identify connections.

15. The method according to claim 14, wherein the labeling includes color coding.

16. The method according to claim 11, wherein each of the fixed connection block, the mobile plug, and the mobile test block include labeling to identify connections.

17. The method according to claim 11, wherein the mobile plug is attached to the fixed connection block by screws.

18. The method according to claim 11, wherein the mobile plug includes pins having coded tips.

19. The method according to claim 18, wherein the coded tips include plastic bars, and at least two of the coded tips have plastic bars which are different from each other.

20. A method for fixing an improperly functioning relay of a power transmission and distribution grid, comprising:
    providing a replacement relay which is properly configured;
    providing a fixed connection block connected to the power transmission and distribution grid;
    providing a mobile plug which connects the fixed connection block and an original relay when the mobile plug is inserted into the fixed connection block, and
    testing the original relay and when it is not functioning correctly, replacing the original relay with the replacement relay,
    wherein the fixed connection block provides internal shorting that is activated when the mobile plug is not inserted into the fixed connection block and is deactivated when the mobile plug is inserted into the fixed connection block, and
    wherein the fixed connection block and mobile plug provides an interaction between a power transmission and distribution grid side and a relay side when the mobile plug is inserted into the fixed connection block.

* * * * *